(12) United States Patent
Schimper (10) Patent No.: US 7,176,822 B2
(45) Date of Patent: Feb. 13, 2007

(54) ANALOGUE-TO-DIGITAL CONVERTER

(75) Inventor: Markus Schimper, Moosinning (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/247,021

(22) Filed: Oct. 11, 2005

(65) Prior Publication Data
US 2006/0077090 A1 Apr. 13, 2006

(30) Foreign Application Priority Data
Oct. 11, 2004 (DE) ............ 10 2004 049 481

(51) Int. Cl.
*H03M 3/00* (2006.01)
(52) U.S. Cl. .................... 341/143; 341/120
(58) Field of Classification Search ........... 341/143, 341/144, 155, 120
See application file for complete search history.

(56) References Cited

U.S. PATENT DOCUMENTS

| | | | |
|---|---|---|---|
| 5,187,481 A * | 2/1993 | Hiller | 341/131 |
| 6,346,898 B1 | 2/2002 | Mclanson | |
| 6,426,714 B1 * | 7/2002 | Ruha et al. | 341/143 |
| 6,462,685 B1 * | 10/2002 | Korkala | 341/131 |
| 6,674,381 B1 * | 1/2004 | Gomez et al. | 341/143 |
| 6,738,004 B2 * | 5/2004 | Melanson | 341/143 |
| 6,744,392 B2 * | 6/2004 | Melanson | 341/143 |
| 6,768,437 B1 * | 7/2004 | Ruotsalainen et al. | 341/143 |
| 6,970,120 B1 * | 11/2005 | Bjornsen | 341/120 |

OTHER PUBLICATIONS

"A Dynamic Element Matching Technique for Reduced-Distortion Multibit Quantization in Delta-Sigma ADCs", Eric Fogleman and Ian Galton, IEEE Transactions On Circuits And Systems—II, Analog and Digital Signal Processing, vol. 48, No. 2, Feb. 2001, pp. 158-170.

"10-Bit, 3mW Continuous-Time Sigma-Delat ADC for UMTS in a 0.12 μm CMOS Process", Lukas Dörrer, Franz Kuttner, Andreas Wiesbauer, Antonio Di Giandomenica and Thomas Hartig, Proceedings of the 29th European Solid-State Circuits Conference, 2003, ESSCIRC '03, Sep. 16-18, 2003, 5 pgs.

* cited by examiner

*Primary Examiner*—Peguy JeanPierre
(74) *Attorney, Agent, or Firm*—Eschweiler & Associates, LLC (57) ABSTRACT

An analogue-to-digital converter includes a summing element for combining an analogue input signal of the analogue-to-digital converter with a feedback signal in order to generate a fault signal, a quantizer which has comparators for comparing the fault signal with reference voltages in order to generate a digital output signal, a digital-to-analogue converter for converting the digital output signal into the feedback signal, a control device for generating a control signal from the digital output signal in order to control the use of elements of the digital-to-analogue converter in such a way that mismatching of the elements is compensated, a random number generating device for generating random numbers which are used in the quantizer to interchange the assignment of the reference voltages to the comparators in order to eliminate an effect of offset voltages at inputs of the comparators, and a compensation device for generating a compensated control signal from the control signal as a function of the random numbers in order to compensate the interchanging of the assignment of the reference voltages.

17 Claims, 5 Drawing Sheets

ANALOGUE-TO-DIGITAL CONVERTER

REFERENCE TO RELATED APPLICATIONS

This application claims the benefit of the priority date of German application DE 10 2004 049 481.9, filed on Oct. 11, 2004, the contents of which are herein incorporated by reference in their entirety.

FIELD OF THE INVENTION

The present invention relates generally to analogue-to-digital converters and in particular to sigma-delta analogue-to-digital converters.

BACKGROUND OF THE INVENTION

Analogue-to-digital converters are an important component in many electrical sensor, control and communications systems.

Currently there are two basic types of analogue-to-digital converters (ADC). Analogue-to-digital converters with an open loop and fed-back analogue-to-digital converters. An analogue-to-digital converter with an open loop generates a digital code directly from an analogue input signal and is generally asynchronous in terms of operation. In contrast, a fed-back analogue-to-digital converter (DAC=Digital-to-Analogue Converter) generates a digital code from an analogue input signal, converts this digital code back into an analogue signal and uses this analogue signal as a feedback signal.

An example of fed-back converters are sigma-delta analogue-to-digital converters. Sigma-delta analogue-to-digital converters achieve high resolution by means of a high clock frequency instead of precisely matching circuit-internal components such as, for example, resistors and capacitors which are used in analogue-to-digital converters with an open loop. Sigma-delta analogue-to-digital converters are therefore used in many integrated circuits.

A sigma-delta analogue-to-digital converter receives an analogue input signal and subtracts a feedback signal from the input signal in order to generate an analogue fault signal. The fault signal is processed by a low-pass filter and then quantized in a quantizer in order to generate a digital output signal. A digital-to-analogue converter with feedback converts the digital output signal into an analogue signal or the feedback signal. The quantizer usually has a voltage divider for generating reference voltages and a respective comparator for each reference voltage. Each comparator compares the analogue input signal with a respective reference voltage (quantization stage) and forms the digital output signal from the comparison results. The sigma-delta analogue-to-digital converter is operated with a clock frequency or sampling frequency fs which according to the Nyquist criterion is at least twice as high as the highest frequency components of the analogue input signal. The ratio of the sampling frequency fs which is actually used to the minimum necessary sampling frequency is referred to as the oversampling ratio.

In sigma-delta analogue-to-digital converters, non-linearity reduces the signal-to-noise ratio in a useful frequency range, generates harmonics in the output spectrum of the output signal and changes the noise in the frequency range fs/20 to fs/2. The non-linearity is caused by the quantization steps of the quantizer, by offset errors or offset voltages $V_{os}$ at the inputs of the comparators of the quantizer and by mismatchings of elements of the non-ideal voltage divider such as, for example, resistors and elements of the digital-to-analogue converter with feedback, for example power sources. The offset voltages $V_{os}$ at the inputs of the comparators are dominated by process-internal threshold voltage mismatchings and become increasingly problematic as the signal excursion is reduced or the quantization increment is reduced.

The signal-to-noise ratio (SNR) and the resolution of the sigma-delta analogue-to-digital converter can be improved by increasing the sampling frequency or the oversampling ratio. Quantization noise of the quantizer is thus distributed over a larger frequency range and the useful frequency range and can be sufficiently damped or removed outside the useful frequency range downstream of the quantizer using a conventional filter.

A known possible way of solving the problem of offset voltages is to correct the offset voltages at the inputs of the comparators in the sigma-delta analogue-to-digital converter using a calibration algorithm. Disadvantages of this method are that it is costly and that there must be sufficient time available for the calibration before the sigma-delta analogue-to-digital converter is switched on.

A known possible way of solving the problem of mismatchings of resistance is to improve the matching of the components in the quantizer. However, a disadvantage of this solution is that the parasitic influences and the use of surface area increase quadratically with the improvement in the matching.

U.S. Pat. No. 6,346,898 B1 describes a further possible way of solving the abovementioned problems.

Figure 2:
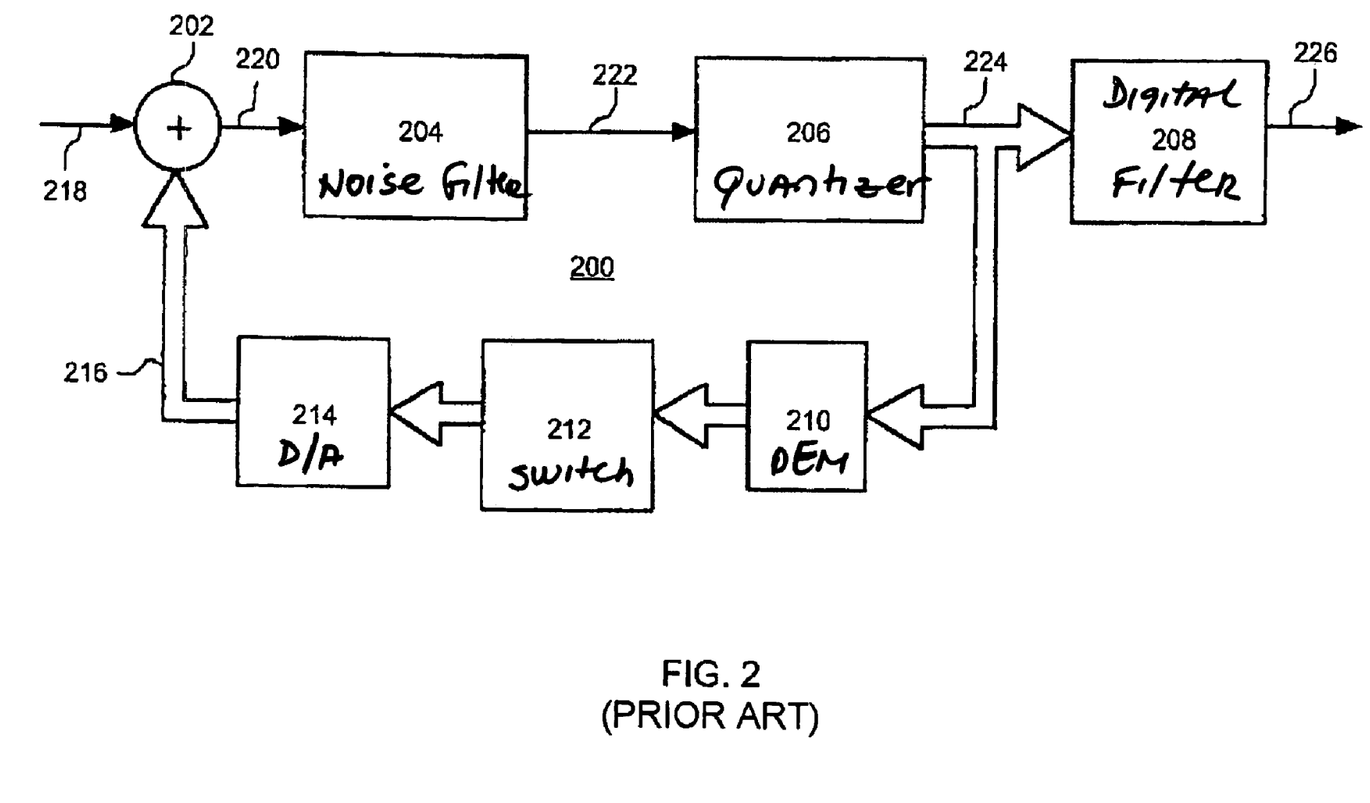
FIG. 2 shows a known analogue-to-digital converter.

FIG. 2 shows a known sigma-delta analogue-to-digital converter which is described in U.S. Pat. No. 6,346,898 B1 and is shown there in FIG. 2. The sigma-delta analogue-to-digital converter 200 has a summing element 202, a noise-forming filter 204, a quantizer 206, a digital filter 208, a control device for dynamic element matching (DEM) 210, a switching device 212 and a digital-to-analogue converter 214. One input of the sigma-delta analogue-to-digital converter 200 is connected to a first input of the summing element 202. A second input of the summing element 202 is connected to an output of the digital-to-analogue converter 214. One output of the summing element 202 is connected to an input of the noise-forming filter 204. One output of the noise-forming filter 204 is connected to an input of the quantizer 206. One output of the quantizer 206 is connected to an input of the digital filter 208 and to an input of the control device for dynamic element matching 210. One output of the control device for the dynamic element matching 210 is connected to an input of the switching device 212. One output of the switching device 212 is connected to an input of the digital-to-analogue converter 214. The control device for the dynamic element matching 210, the switching device 212 and the digital-to-analogue converter 214 form a feedback loop to the summing element 202. The noise-forming filter 204 is normally a low-pass filter. The quantizer 206 typically has an array of comparators. The digital filter 208 is decimation filter.

An analogue output signal 216 of the digital-to-analogue converter 214 is combined with an analogue input signal 218 of the sigma-delta analogue-to-digital converter 200 by the summing element 202 in order to generate an analogue fault signal 220. The fault signal 220 is filtered by the noise-forming filter 204 in order to generate a filtered output signal 222 which is fed to the quantizer 206. A digital multibit output signal 224 of the quantizer 206 is an input signal of the digital filter 208 and of the control device for the dynamic element matching 210. The digital filter 208 divides the useful frequency range from the multibit output signal 224 and passes on said range for digital signal processing as an output signal 226 of the sigma-delta analogue-to-digital converter 200. The control device for the dynamic element matching 210 and the switching device 212 determine the use of the elements in the digital-to-analogue converter 214. The control device for the dynamic element matching 210 may, for example, be designed to ensure that all the elements of the digital-to-analogue converter 214 are used in a proportionally identical fashion with respect to time.

Figure 3:
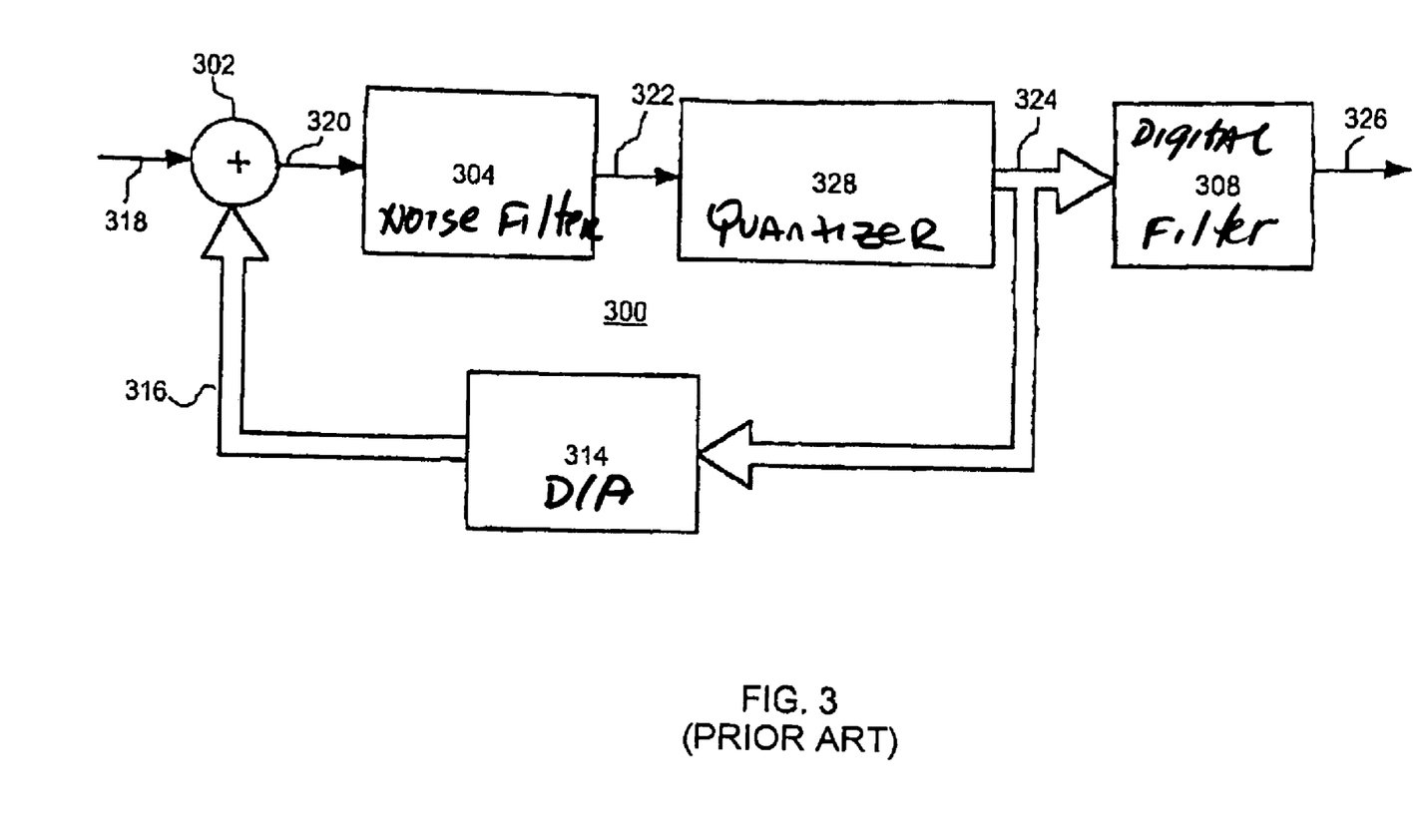
FIG. 3 shows a further known analogue-to-digital converter.

FIG. 3 shows a further known sigma-delta analogue-to-digital converter which is described in U.S. Pat. No. 6,346,898 B1 and shown there in FIG. 4. The sigma-delta analogue-to-digital converter 300 has a summing element 302, a noise-forming filter 304, a quantizer 328 with a control device for dynamic element matching (DEM), a digital filter 308 and a digital-to-analogue converter 314. One input of the sigma-delta analogue-to-digital converter 300 is connected to a first input of the summing element 302. A second input of the summing element 302 is connected to an output of the digital-to-analogue converter 314. One output of the summing element 302 is connected to an input of the noise-forming filter 304. One output of the noise-forming filter 304 is connected to an input of the quantizer 328. One output of the quantizer 328 is connected to an input of the digital filter 308 and to an input of the digital-to-analogue converter 314. The noise-forming filter 304 is generally a cascade of integrators. The quantizer 328 has comparators. The digital filter 308 generally has a decimator which outputs the output signal 326 with a suitable sampling rate for the system. The digital filter 308 is, for example, a low-pass filter.

An analogue input signal 318 of the sigma-delta analogue-to-digital converter 300 is added to a feedback signal or an analogue output signal 316 by the digital-to-analogue converter 314 in order to generate a fault signal 320 which is fed to the noise-forming filter 304. A filtered output signal 322 of the noise-forming filter 304 is fed to the quantizer 328 which generates a digital multibit output signal 324. The quantizer 328 uses the comparators to select that multibit output signal 324 which is closest to the filtered output signal 322 of the noise-forming filter 304. The control device for the dynamic element matching (DEM) in the quantizer 328 determines the use of the comparators. The digital multibit output signal 324 is fed to the digital filter 308 and is filtered by it in order to remove the quantization noise which lies outside the useful frequency range and is caused by the quantizer 328, and in order to generate a digital output signal 326 for further digital signal processing. The output signal 326 is the output signal of the sigma-delta analogue-to-digital converter 300. The multibit output signal 324 is also fed to the digital-to-analogue converter 314 which converts the multibit output signal 324 into the analogue output signal 316. It is to be noted that the ratio between the sampling rate of the noise-forming filter 304 and the output sampling rate of the output signal 326 is the oversampling ratio.

Figure 4:
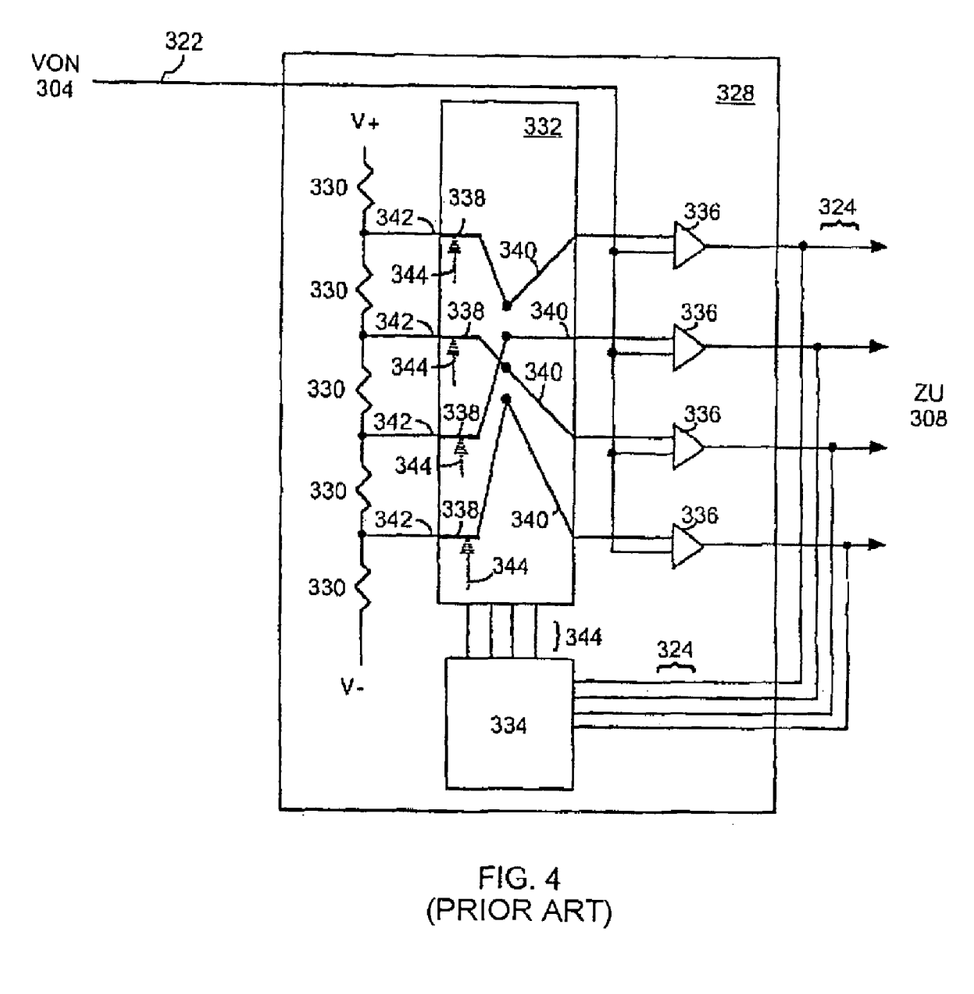
FIG. 4 shows details of a quantizer in FIG. 3.

FIG. 4 shows the quantizer from FIG. 3 which is described in U.S. Pat. No. 6,346,898 B1 and is shown there in FIG. 5. The quantizer 328 has a series of resistors 330, a switching device 332, a control device for dynamic element matching 334 and a series of comparators 336. The switching device 332 contains switches 338 which connect a respective input of said switching device 332 to a selected output 340 of same.

The filtered output signal 322 from the noise-forming filter 304 (FIG. 3) is fed to the series of comparators 336. The other signals to the comparators 336 are generated by the series of resistors 330 which divides the voltage V+/V− into reference voltages 342. These reference voltages 342 are typically spaced apart at equal intervals. The comparators 336 generate the multibit output signal 324. The dynamic element matching is carried out by the switching device 332 which is controlled by the control device for the dynamic element matching (DEM) 334 by means of control signals 344. The switches 338 are switched by these control signals 344 on the basis of the multibit output signal 324. Only one configuration of the switching device 332 is shown for the sake of clarification. However, any reference voltage 342 can be connected to any output 340 by means of a switch 338 under the control of the control signals 344. It is to be noted that each reference voltage 342 is fed to just one comparator 336.

While the control device is operating for the dynamic element matching 210 and 334 in FIGS. 2 and 4, the most necessary elements m are determined from a total number of n elements of the digital-to-analogue converter 214 or of the quantizer 328, with the most necessary elements then being used. The degree of need is updated for the next selection on the basis of the use over time. In the case of dynamic 1st order element matching the degree of need is based on the total use of each element, with the most necessary element being the element which has been used least. In the case of dynamic 2nd order element matching the timed control of the use is also taken into account.

The linearity error in the quantizer 328 is, as mentioned, determined inter alia by the offset voltages at the inputs of the comparators at the decision threshold. On the other hand, the linearity error in the digital-to-analogue converter 214 is determined by the mismatching of all the active elements of the said digital-to-analogue converter 214. Since only one comparator, specifically the comparator whose reference voltage is still just below the voltage to be digitized ever determines the linearity in the quantizer 328, and a plurality of elements determine the linearity in the digital-to-analogue converter 214, the known DEM method described above has different effects in the digital-to-analogue converter and in the quantizer.

One disadvantage of the devices and methods described in U.S. Pat. No. 6,346,898 B1 is that the second and third harmonics of the output signal of the sigma-delta analogue-to-digital converter are only slightly damped. The output spectrum of the output signal also exhibits an increase at measurements in the region fs/20 to fs/2.

The article A Dynamic Element Matching Technique for Reduced-Distortion Multibit Quantization in sigma-delta-ADCs IEEE Transaction on Circuits and Systems-II: Analogue and Digital Signal Processing, VOL. 48, NO. 2, FEBRUARY 2001, by Eric Fogleman and Ian Galton describes a further known possible way of solving the problem of offset voltages at the inputs of the comparators.

In Fogleman et al., the interference which is introduced at the inputs of the comparators by the offset voltages is reduced by modulating the sign of each offset voltage $V_{os}$ with a random bit sequence. This method is referred to as comparator offset DEM in Fogleman et al.

Figure 5:
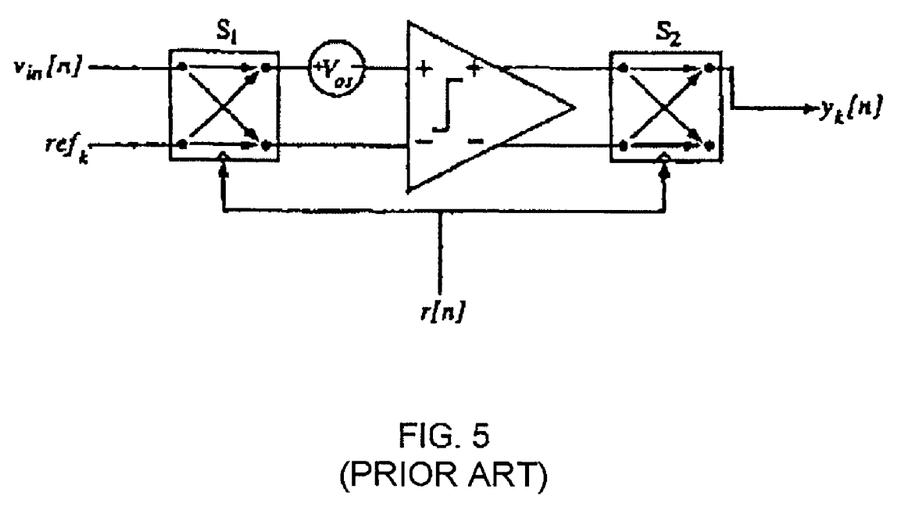
FIG. 5 shows a known comparator with comparator offset DEM.

FIG. 5 shows a known comparator which is described in the article by Eric Fogleman and Ian Galton and is shown there in FIG. 3. The comparator offset DEM is implemented in a sigma-delta analogue-to-digital converter using swapper cells S1 and S2 at an analogue input and an analogue output of each comparator k. In FIG. 5, $V_{in}[n]$ is the instantaneous value of an analogue input signal, $ref_k$ is a reference level of a voltage divider connected upstream, r[n] is a control signal and $y_k[n]$ is a digital output signal sequence. The control signal $r[n]$ is a ±pseudo-random 1-bit sequence. If $r[n]=1$, the direct paths through S and S2 are selected, and if $r[n]=-1$ the swapped paths through S1 and S2 are selected. The swapping causes two quantization thresholds per comparator, which are selected by the value of the pseudo-random sequence $r[n]$.

A disadvantage of the method by Eric Fogleman and Ian Galton is that as a result only the even numbered harmonics such as the second, fourth and sixth harmonic in the output signal of the sigma-delta analogue-to-digital converter can be reduced. The uneven harmonics such as the third, fifth and seventh harmonic are not reduced.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention provides an analogue-to-digital converter which has a low signal-to-noise ratio and permits simple and efficient reduction of harmonics in an output signal of said analogue-to-digital converter.

The present invention can convert offset voltages at inputs of comparators in an analogue-to-digital converter into spectral white noise and convert the mismatching of elements of a digital-to-analogue converter with feedback into first order noise in the analogue-to-digital converter, i.e. noise which depends linearly on the frequency. The correction of offset voltages at the inputs of the comparators and the correction of the mismatching of elements of the digital-to-analogue converter are implemented for this purpose with different methods.

In accordance with an aspect of the present invention, the invention provides an analogue-to-digital converter having a summing element for combining an analogue input signal of the analogue-to-digital converter with an analogue feedback signal in order to generate an analogue fault signal, a quantizer which has comparators for comparing the fault signal with reference voltages in order to generate a digital output signal, a digital-to-analogue converter for converting the digital output signal into the analogue feedback signal, a control device for dynamic element matching for generating a control signal from the digital output signal in order to control the use of elements of the digital-to-analogue converter in such a way that mismatching of the elements is compensated, a random number generating device for generating random numbers which are used in the quantizer to interchange the assignment of the reference voltages to the comparators in order to eliminate an effect of offset voltages at inputs of the comparators, and a compensation device for generating a compensated control signal from the control signal as a function of the random numbers in order to compensate the interchanging of the assignment of the reference voltages while the use of the elements of the digital-to-analogue converter is being controlled.

As a result, the abovementioned influences of the static or element-related, chronologically constant non-linearity of the quantizer on the sigma-delta analogue-to-digital converter are reduced using quantizer scrambling by means of random numbers.

Furthermore, the present invention compensates, in some aspects, the consequences of non-linearity of the quantizer completely and thus suppresses harmonics completely.

Additionally, requirements made of the matching of the comparators can be reduced by means of said invention, resulting in smaller areas and reduced parasitic influences.

In accordance with an aspect of the present invention, the use of the elements of the digital-to-analogue converter is controlled in such a way that the mismatching of the elements is converted into 1st order noise.

In accordance with yet another aspect of the present invention, the random numbers in the quantizer are used to convert the offset voltages at the inputs of the comparators into white noise.

In accordance with another aspect of the present invention, the control device has a modulo counter for the dynamic element matching.

In accordance with yet another aspect of the present invention, the random numbers are integers between 0 and N−1, where N is the number of comparators.

In accordance with another aspect of the present invention, the random number generating device has linear feedback shift registers for generating the random numbers.

In accordance with yet another aspect of the present invention, the analogue-to-digital converter has a switching device for generating a modified output signal from the output signal under the control of the compensated control signal in order to compensate the interchanging of the reference voltages while the use of the elements of the digital-to-analogue converter is being controlled.

In accordance with another aspect of the present invention, the quantizer has a switching device which has inputs for applying the reference voltages and outputs for outputting interchanged reference voltages to the comparators, the switching device interchanging the assignment of the inputs to the outputs as a function of the random numbers.

In accordance with yet another aspect of the present invention, the quantizer also has a reference voltage generating device for generating the reference voltages.

In accordance with another aspect of the present invention, the reference voltage generating device has a series of resistors or power sources.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

Exemplary embodiments of the present invention are explained in more detail below with reference to the appended drawings, in which.

DETAILED DESCRIPTION OF THE INVENTION

One or more implementations of the present invention will now be described with reference to the attached drawings, wherein like reference numerals are used to refer to like elements throughout, and wherein the illustrated structures are not necessarily drawn to scale.

In the figures, identical reference symbols or reference symbols which consist of the figure number as the highest number and identical numbers as lower numbers designate identical or functionally identical components.

Figure 1:
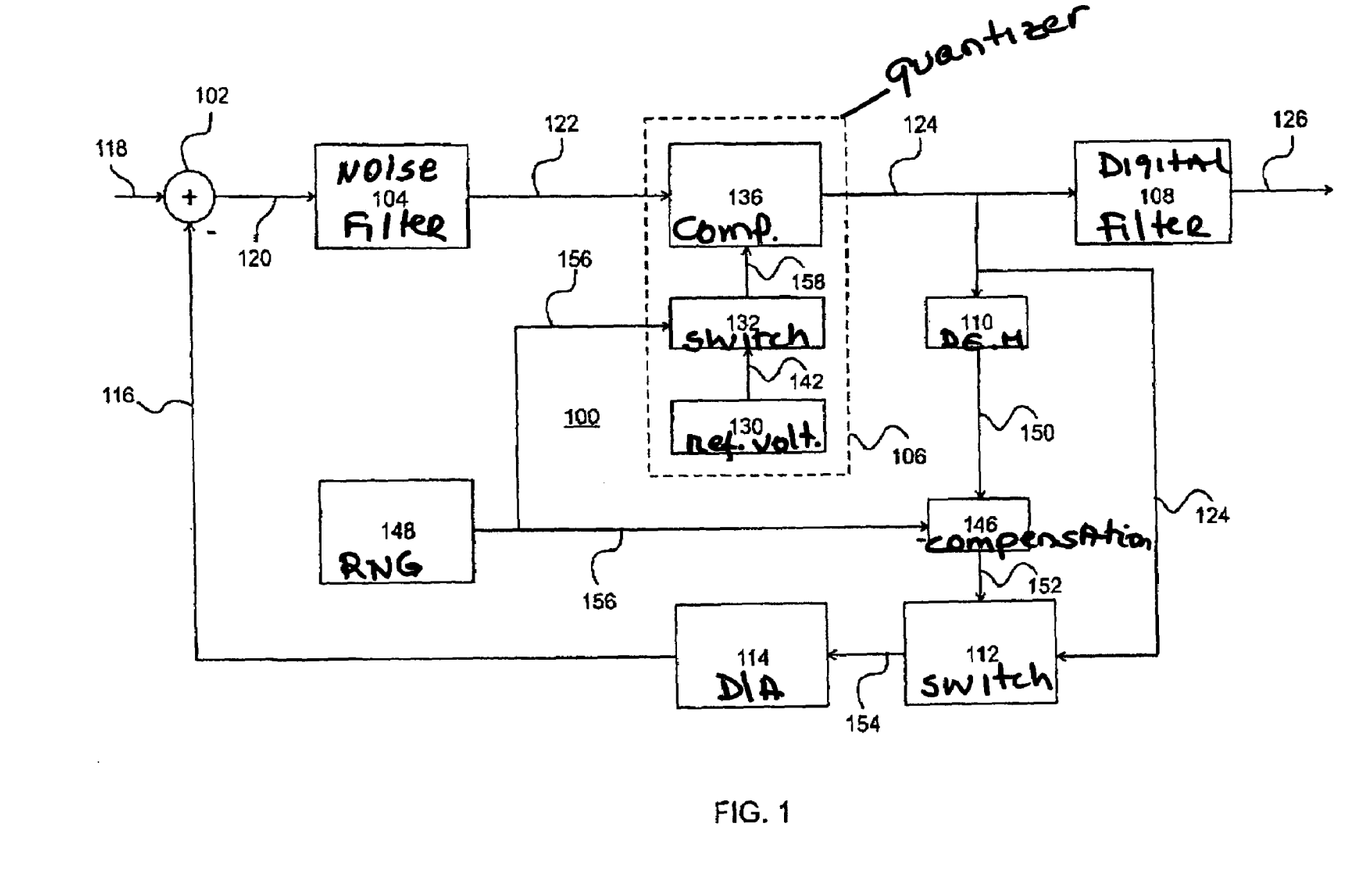
FIG. 1 shows an analogue-to-digital converter according to the invention.

FIG. 1 shows an analogue-to-digital converter according to the invention. The analogue-to-digital converter 100 has a summing element 102, a noise-forming filter 104, a quantizer 106, a digital filter 108, a control device for dynamic element matching (DEM) 110, a compensation device 146, a switching device 112, a digital-to-analogue converter 114 and a random number generating device 148. The quantizer 106 has a reference voltage generating device 130, a switching device 132 and comparators 136.

An input of the analogue-to-digital converter 100 is connected to a first input of the summing element 102. The input of the analogue-to-digital converter 100 is used to apply an input signal 118. A second output of the summing element 102 is connected to an input of the digital-to-analogue converter 114. The output of the digital-to-analogue converter 114 is used to output an analogue output signal 116 or a feedback signal. One output of the summing element 102 is connected to an input of the noise-forming filter 104. The output of the summing element 102 is used to output a fault signal 120.

One output of the noise-forming filter 104 is connected to a first input of the comparators 136. The output of the noise-forming filter 104 is used to output a filtered output signal 122. Outputs of the comparators 136 are connected to inputs of the digital filter 108, to inputs of the control device for the dynamic element matching 110 and to first inputs of the switching device 112. The outputs of the comparators 136 are used to output a digital multibit output signal 124. One output of the digital filter 108 is connected to an output of the analogue-to-digital converter 100 and is used to output an output signal 126 of the analogue-to-digital converter 100.

One output of the control device for the dynamic element matching 110 is connected to a first input of the compensation device 146. The output of the control device for the dynamic element matching 110 is used to output control signals 150. One output of the compensation device 146 is connected to a second input of the switching device 112. The output of the compensation device 146 is used to output compensated control signals 152. One output of the switching device 112 is connected to an input of the digital-to-analogue converter 114. The output of the switching device 112 is used to output a modified multibit output signal 154.

One output of the random number generating device 148 is connected to a second input of the compensation device 146 and to a first input of the switching device 132 in the quantizer 106. The output of the random number generating device 148 is used to output random numbers 156. Outputs of the reference voltage generating device 130 are connected to second inputs of the switching device 132. The outputs of the reference voltage generating device 130 are used to output reference voltages 142. Outputs of the switching device 132 are connected to inputs of the comparators 136. The outputs of the switching device 132 are used to output reference voltages 158 which are interchanged compared to the reference voltages 142 of the reference voltage generating device 130. The switching device 112 and the digital-to-analogue converter 114 form a feedback loop to the summing element 102.

The noise-forming filter 104 generally has a cascade of integrators and can be a low-pass filter. The comparators 136 can comprise an array of comparators. The reference voltage generating device 130, in one example, has a series of resistors and alternatively power sources or a capacitor network. The digital filter 108 is generally a decimation filter and can be a low-pass filter. The control device for the dynamic element matching 110 has a modulo counter, in one example. The random number generating device 148 can be a digital random generator which has, for example, a plurality of linear feedback shift registers (LSFR). The switching devices 112 and 132 are switching matrices whose inputs and outputs can be connected to one another individually in any desired combination. The compensation device 146, in one example, is a subtractor, for example a modulo subtractor.

While the analogue-to-digital converter 100 is operating, the analogue output signal 116 of the digital-to-analogue converter 114 is combined with the analogue input signal 118 of the analogue-to-digital converter 100 by the summing element 102, for example subtracted from it, in order to generate the analogue fault signal 120. The fault signal 120 is filtered by the noise-forming filter 104 in order to generate the filtered output signal 122 which is fed to the quantizer 106. The filter 104 is used to suppress the quantization noise in the useful frequency range. The quantizer 106 uses comparators to select that digital multibit output signal 124 which is closest to the filtered output signal 122 of the noise-forming filter 104. For this purpose, the reference voltage generating device 130 generates reference voltages 142 for the comparators 136 whose threshold values can be set in a general way.

The multibit output signal 124 of the quantizer 106 is fed to the digital filter 108 which filters the multibit output signal 124 and generates the output signal 126 with a suitable sampling rate for further digital signal processing in a following system. The digital filter 108 extracts the useful frequency range from the multibit output signal 124 or removes the quantization noise which lies outside the useful frequency range and is caused by the quantizer 106.

The random number generating device 148 is typically used, in one example, to generate a sequence of random integers 156 between 0 and N−1. N here is the number of comparators 136 in the quantizer 106. The random numbers 156 are used, in the switching device 132, to shift or rotate the reference voltages 142 which are fed to the switching device 132 by the reference voltage generating device 130, and to output the interchanged reference voltages 158 to the comparators 136. For this purpose, the switching device 132 interchanges the assignment of its inputs and outputs as a function of the random numbers 156 after a new quantization result is present. Whether the reference voltages 142 are rotated by 1 or 2 or N−1 depends on the random number 156. The random shifting or scrambling of the reference voltages 142 linearizes the quantizer 106 and corrects the offset voltages at the inputs of the comparators 136. The non-linearity caused by the offset voltages at the inputs of the comparators 136 is converted into spectral white noise here.

The random rotation or shifting is not sufficient as dynamic element matching for the elements of the digital-to-analogue converter 114. The linearity of the digital-to-analogue converter 114 is however decisive for the function of the analogue-to-digital converter 100. In order to make a saving in terms of area and power, a 1st order mismatch shaping method can be applied in the digital-to-analogue converter 114 with feedback in order to correct the non-linearity of elements, for example power sources, of the digital-to-analogue converter 114. However, more complex methods may alternatively be used.

The control device for the dynamic element matching 110 calculates a rotation value for the assignment of elements of the digital-to-analogue converter 114 from the last quantization result in the multibit output signal 124, the rotation value bringing about 1st order (linear) mismatch shaping in the digital-to-analogue converter 114 and being represented by the control signals 150. The control device for the dynamic element matching 110 can have a modulo counter which counts from 0 to N−1 and then jumps back again to the beginning, i.e. to 0, N being the number of comparators 136. In the compensation device 146, a random number 156 from the random number generating device 148 is subtracted from the rotation value of the control signals 150 or the counting value of the control device for the dynamic element matching 110 in order to negate the random number 156 and generate the compensated control signals 152.

The switching device 112 changes the assignment between the comparators 136 of the quantizer 106 and the elements of the digital-to-analogue converter 114. To be more precise, the switching device 112 interchanges the assignment of its inputs and outputs as a function of the compensated control signals 152 in such a way that the interchanging of the reference voltages 142 is compensated locally by the switching device 132 of the quantizer 106 upstream of the digital-to-analogue converter 114, and outputs the modified multibit output signal 154. The thermometer-coded quantization result in the multibit output signal 124 is thus assigned to the elements of the digital-to-analogue converter 114 in such a way that the mismatching of the elements is converted into 1st order noise. The control device for the dynamic element matching 110, the compensation device 146 and the switching device are similar to a barrel shifter which carries out 1st order mismatch shaping. It is to be noted that the data at the input of the digital-to-analogue converter 114 is equivalent with or without quantization scrambling.

Although the present invention is described above with reference to preferred exemplary embodiments, it is not restricted to them but rather can be modified in a variety of ways.

While the invention has been illustrated and described with respect to one or more implementations, alterations and/or modifications may be made to the illustrated examples without departing from the spirit and scope of the appended claims. In particular regard to the various functions performed by the above described components or structures (assemblies, arrangement, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An analogue-to-digital converter comprising:
   a summing element that combines an analogue input signal with an analogue feedback signal to generate an analogue fault signal;
   a quantizer having comparators that compare the analogue fault signal with reference voltages to generate a digital output signal;
   a digital-to-analogue converter that converts the digital output signal into the analogue feedback signal and comprises elements;
   a control device for dynamic element matching that generates a control signal from the digital output signal to control the elements within the digital-to-analogue converter and compensate for mismatching of the elements;
   a random number generating device that generates random numbers used in the quantizer to interchange assignment of the reference voltages to the comparators in order to mitigate an effect of offset voltages at inputs of the comparators; and
   a compensation device that generates a compensated control signal from the control signal as a function of the random numbers to compensate the assignment of the reference voltages to the comparators while the elements of the digital-to-analogue converter are being controlled.

2. The converter of claim 1, wherein the mismatching of the elements by the control device is converted into first order noise.

3. The converter of claim 1, wherein the quantizer employs the random numbers to convert the offset voltages into white noise.

4. The converter of claim 1, wherein the control device comprises a modulo counter that performs dynamic element matching.

5. The converter of claim 1, wherein the random numbers are integers between 0 and N-1, where N is a number of the comparators.

6. The converter of claim 1, wherein the random number generating device comprises a linear feedback shift register that generates the random numbers.

7. The converter of claim 1, further comprising a switching device that generates a modified output signal from the output signal according to the compensated control signal to compensate the interchanging of the reference voltages.

8. The converter of claim 1, wherein the quantizer comprises a switching device, wherein the switching device has inputs for applying the reference voltages and outputs for outputting interchanged reference voltages to the comparators.

9. The converter of claim 1, wherein the quantizer comprises a reference voltage generating device that generates the reference voltages.

10. The converter of claim 9, wherein the reference voltage generating device comprises a series of resistors that provide the reference voltages.

11. An analogue-to-digital converter comprising:
    a summing element that combines an analogue input signal with an analogue feedback signal to generate an analogue fault signal;
    a noise forming filter that filters the analogue fault signal to form a filtered analogue fault signal;
    a quantizer comprising:
       a reference voltage generating device that generates reference voltages;

a quantizer switching device that receives the reference voltages and generates interchanged reference voltages according to random numbers; and comparators that compare the filtered analogue fault signal with the interchanged reference voltages to generate a digital output signal;

a digital-to-analogue converter that converts a modified output signal into the analogue feedback signal and comprises elements;

a control device for dynamic element matching that generates a control signal from the digital output signal to control the elements within the digital-to-analogue converter and compensate for mismatching of the elements;

a random number generating device that generates the random numbers used in the quantizer to interchange assignment of the reference voltages to the comparators in order to mitigate an effect of offset voltages at inputs of the comparators;

a compensation device that generates a compensated control signal from the control signal as a function of the random numbers to compensate the assignment of the reference voltages to the comparators while the elements of the digital-to-analogue converter are being controlled; and a switching component that receives the digital output signal and the compensated control signal and generates the modified output signal according to the digital output signal and the compensated control signal.

12. The converter of claim 11, further comprising a switching device that generates a modified output signal from the output signal according to the compensated control signal.

13. The converter of claim 11, wherein the digital output signal is a digital multibit output signal.

14. The converter of claim 11, wherein the noise-forming filter comprises a cascade of integrators.

15. An analogue-to-digital converter comprising:

a summing element that receives an analogue input signal and a feedback signal and generates a fault signal;

a random number generating device that generates random numbers;

a quantizer that comprises comparators and receives the fault signal and generates a multibit digital output signal according to the fault signal, reference voltages, and the random numbers;

a control device that generates a control signal according to the multibit digital output signal;

a feedback path that receives the control signal and the multibit digital output signal and generates the feedback signal according to the control signal and the multibit digital output signal;

a digital-to-analogue converter within the feedback path that comprises elements and generates the feedback signal from the multibit digital output signal and the control signal; and a compensation device that generates a compensated control signal from the control signal as a function of the random numbers to compensate the assignment of the reference voltages to the comparators while the elements of the digital-to-analogue converter are being controlled.

16. The converter of claim 15, wherein the feedback patch comprises a switching element that receives the control signal and the multibit digital output signal and generates a modified output signal there from.

17. The converter of claim 15, wherein the quantizer comprises switching elements that receive the reference voltages and the random numbers and generates modified reference voltages there from and the comparators compare the modified reference voltages with the fault signal to generate the multibit digital output signal.

* * * * *